(12) United States Patent
Ho et al.

(10) Patent No.: US 7,247,951 B2
(45) Date of Patent: Jul. 24, 2007

(54) CHIP CARRIER WITH OXIDATION PROTECTION LAYER

(75) Inventors: Kwun-Yao Ho, Hsin-Tien (TW); Moriss Kung, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/022,244

(22) Filed: Dec. 23, 2004

(65) Prior Publication Data

US 2006/0055023 A1 Mar. 16, 2006

(30) Foreign Application Priority Data

Sep. 10, 2004 (TW) .............................. 93127403 A

(51) Int. Cl.
*H01L 23/52* (2006.01)
(52) U.S. Cl. .............................. 257/786; 257/E23.055; 257/E23.56; 257/E23.092; 257/E23.012; 257/E23.124; 257/700; 257/701; 257/758; 257/692; 257/738; 257/737
(58) Field of Classification Search .......... 257/E23.06, 257/E23.055, E23.056, E23.092, E23.012, 257/E23.124, 668, 700, 701, 758, 784, 786, 257/692, 737, 738
See application file for complete search history.

(56) References Cited

U.S. PATENT DOCUMENTS

| | | | | |
|---|---|---|---|---|
| 4,946,733 A | * | 8/1990 | Seeger et al. ................ | 428/209 |
| 5,467,252 A | * | 11/1995 | Nomi et al. ................. | 361/760 |
| 5,837,356 A | * | 11/1998 | Katori et al. ................ | 428/210 |
| RE36,773 E | * | 7/2000 | Nomi et al. ................. | 361/760 |
| 6,165,885 A | * | 12/2000 | Gaynes et al. .............. | 438/612 |
| 6,265,075 B1 | * | 7/2001 | Klueppel et al. ............ | 428/418 |
| 6,353,420 B1 | * | 3/2002 | Chung ........................ | 343/895 |
| 6,421,013 B1 | * | 7/2002 | Chung ................. | 343/700 MS |
| 6,486,551 B1 | * | 11/2002 | Sato et al. ................... | 257/737 |
| 6,582,979 B2 | * | 6/2003 | Coccioli et al. ............. | 438/25 |
| 6,640,432 B1 | * | 11/2003 | Mathieu et al. .............. | 29/842 |
| 6,680,440 B1 | * | 1/2004 | Russell et al. ............. | 174/260 |
| 6,706,564 B2 | * | 3/2004 | Kim et al. .................. | 438/125 |
| 6,707,152 B1 | * | 3/2004 | Schrock ...................... | 257/738 |
| 6,744,135 B2 | * | 6/2004 | Hasebe et al. ............. | 257/712 |
| 6,754,952 B2 | * | 6/2004 | Takano et al. ................ | 29/852 |
| 6,768,064 B2 | * | 7/2004 | Higuchi et al. ............ | 174/267 |
| 6,815,126 B2 | * | 11/2004 | Fey et al. ....................... | 430/9 |
| 6,852,625 B2 | * | 2/2005 | Shin et al. .................. | 438/678 |

(Continued)

FOREIGN PATENT DOCUMENTS

JP 8-78599 * 3/1996

*Primary Examiner*—Alexander Oscar Williams
(74) *Attorney, Agent, or Firm*—J.C. Patents

(57) ABSTRACT

A chip carrier comprising a laminated layer and an oxidation protection layer is provided. The oxidation protection layer is a non-electrolytic metallic coating or an organic oxidation protection film on the surface of bonding finger pads or other contacts formed by deploying a simple, fast film-coating technique. Therefore, there is no need to plate a Ni/Au layer on the bonding pads or contacts using expensive electro-plating equipment for preventing oxidation and there is no need to fabricate plating lines on the chip carrier or reserve space for laying out the plating lines. Thus, the cost for fabricating the chip carrier is reduced, the effective area of the chip carrier is increased and the electrical performance of the chip carrier is improved.

13 Claims, 2 Drawing Sheets

U.S. PATENT DOCUMENTS

| | | | |
|---|---|---|---|
| 6,867,493 B2* | 3/2005 | Hashemi et al. | 257/717 |
| 6,872,590 B2* | 3/2005 | Lee et al. | 438/106 |
| 6,916,687 B2* | 7/2005 | Ho et al. | 438/120 |
| 2004/0099961 A1* | 5/2004 | Chu et al. | 257/781 |
| 2004/0149332 A1* | 8/2004 | Tanaka et al. | 136/256 |
| 2004/0201094 A1* | 10/2004 | Sato et al. | 257/700 |
| 2004/0212088 A1* | 10/2004 | Chen et al. | 257/738 |
| 2005/0224918 A1* | 10/2005 | Kobayashi et al. | 257/600 |
| 2006/0014326 A1* | 1/2006 | Aauburger et al. | 438/123 |

* cited by examiner

CHIP CARRIER WITH OXIDATION PROTECTION LAYER

CROSS-REFERENCE TO RELATED APPLICATION

This application claims the priority benefit of Taiwan application serial no. 93127403, filed on Sep. 10, 2004.

BACKGROUND OF THE INVENTION

1. Field of the Invention

The present invention relates to a circuit substrate. More particularly, the present invention relates to a chip carrier and a chip package structure thereof.

2. Description of the Related Art

With the rapid progress in electronic technologies, high-tech products having more functions and humanized setup are introduced everyday. Furthermore, a light and compact body is the design trend in most electronic products. In the fabrication of semiconductors, chip carrier is one of the most common structural components. A chip carrier can be an organic dielectric substrate or an inorganic dielectric substrate comprising a plurality of alternately laid patterned conductive layers and dielectric layers. The dielectric layer is disposed between two adjacent patterned conductive layers and the patterned conductive layers can be electrically connected through a plating through hole (PTH) or a via passing through the dielectric layers. Since a chip carrier can provide a dense wiring, compact assembly and good electrical performance, it has become one of the preferred elements for fabricating chip packages.

According to the process of attaching and electrically connecting a chip to a chip carrier, chip packages are classified into wire-bonding package and flip-chip bonding packages. FIG. 1 is a schematic cross-sectional view showing part of a conventional wire-bonding chip package structure. The chip package structure 100 in FIG. 1 essentially comprises a chip 110, a plurality of bonding wires 116 and a chip carrier 120. Bonding pads 114 on the chip 110 are electrically connected to the bonding finger pads 124 on the surface 122 of the chip carrier 120 through bonding wires 116. Since the bonding wires 116 are broadly fabricated by gold, the cost of fabricating wire-bonding packages is high. Besides, in order to prevent the oxidation, a nickel/gold (Ni/Au) layer 128 serving as an anti-oxidation layer is formed over the surface of the bonding finger pads 124 outside the solder mask layer 140 or the surface of the lower contacts 126 for connecting with external devices. The nickel/gold layer 128 also serves as an adhesion layer for enhancing the bonding strength between a solder ball 160 and corresponding lower contact 126.

It should be noted that the conventional electroplating method of forming a nickel/gold layer has the following disadvantages:

1. The time and cost involved in performing an electroplating operation is too high. Therefore, plating a nickel/gold film over the bonding finger pad to serve as an oxidation protection layer increases the production cost of the package.

2. At least one plating line connecting all the bonding finger pads has to be fabricated on the chip carrier before the electroplating process. However, the plating line will occupy some layout area on the chip carrier and reduce the effective area for forming other circuits or devices.

3. The plating line may affect the electrical performance of the chip package.

4. Nickel has a relatively high resistance and may contain some impurities. Ultimately, the signal transmission quality may be affected.

In view of the foregoing, if the process of electroplating a nickel/gold film can somehow be unnecessary, the time and cost to fabricate a chip carrier can be reduced and the effective area of the chip carrier can be increased. Moreover, the electrical performance of the chip package is improved. That is why the present invention concerned to overcome.

SUMMARY OF THE INVENTION

Accordingly, at least one objective of the present invention is to provide a chip carrier whose oxidation protection layer can be fabricated quickly so that the time and cost of the chip carrier fabrication is reduced.

A second objective of the present invention is to provide a chip carrier having a larger effective area and a chip package structure having a better electrical performance.

To achieve these and other advantages and in accordance with the purpose of the invention, as embodied and broadly described herein, the invention provides a chip carrier for carrying a chip. The chip carrier comprises a laminated layer and an oxidation protection layer. The laminated layer has a top surface and a bottom surface. The laminated layer further comprises at least a bonding finger pad on the top surface suitable for electrically connection with the chip through a bonding wire. The oxidation protection layer covers the bonding finger pad. In addition, the oxidation protection layer is selected from either a non-electrolytic metallic coating or an organic oxidation protection film. Each of the bonding wires will break a portion of the oxidation protection layer during the bonding process for the direct contact between the end of the bonding wire and the bonding finger pad.

To achieve the aforementioned objectives, the present invention provides a chip package structure essentially comprising a chip, a chip carrier and at least a bonding wire. The chip is disposed on the chip carrier and electrically connected to the chip carrier. The chip carrier has a laminated layer and an oxidation protection layer. The laminated layer has at least a bonding finger pad on a top surface. The oxidation protection layer covers the bonding finger pad. Furthermore, the oxidation protection layer is selected from either a non-electrolytic metallic coating or an organic oxidation protection film. Each of the bonding wires will break a portion of the oxidation protection layer during the bonding process for the direct contact between the end of the bonding wire and the bonding finger pad.

According to one preferred embodiment of the present invention, the organic oxidation protection film is selected from organic surface preservation (OSP) or self-assembly monolayer (SAM). On another hand, the metallic layer for the oxidation protection layer is formed by performing a chemical flashing process, a physical vapor deposition process, an electroless plating process or an immersion process. Furthermore, the oxidation protection layer has a thickness smaller than or equal to 0.5 µm.

The present invention utilizes a simple and fast film-forming technique to form an oxidation protection layer over the exposed bonding finger pads or other contacts. Hence, there is not necessary to coat a nickel/gold film over the bonding finger pads or other contacts to serve as an oxidation protection layer using expensive electroplating equipment nor to form plating line on the chip carrier or reserve space for laying the plating line. In other words, time and cost for fabricating the chip carrier is reduced, the effective area of the chip carrier is increased and the electrical performance of the chip package is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
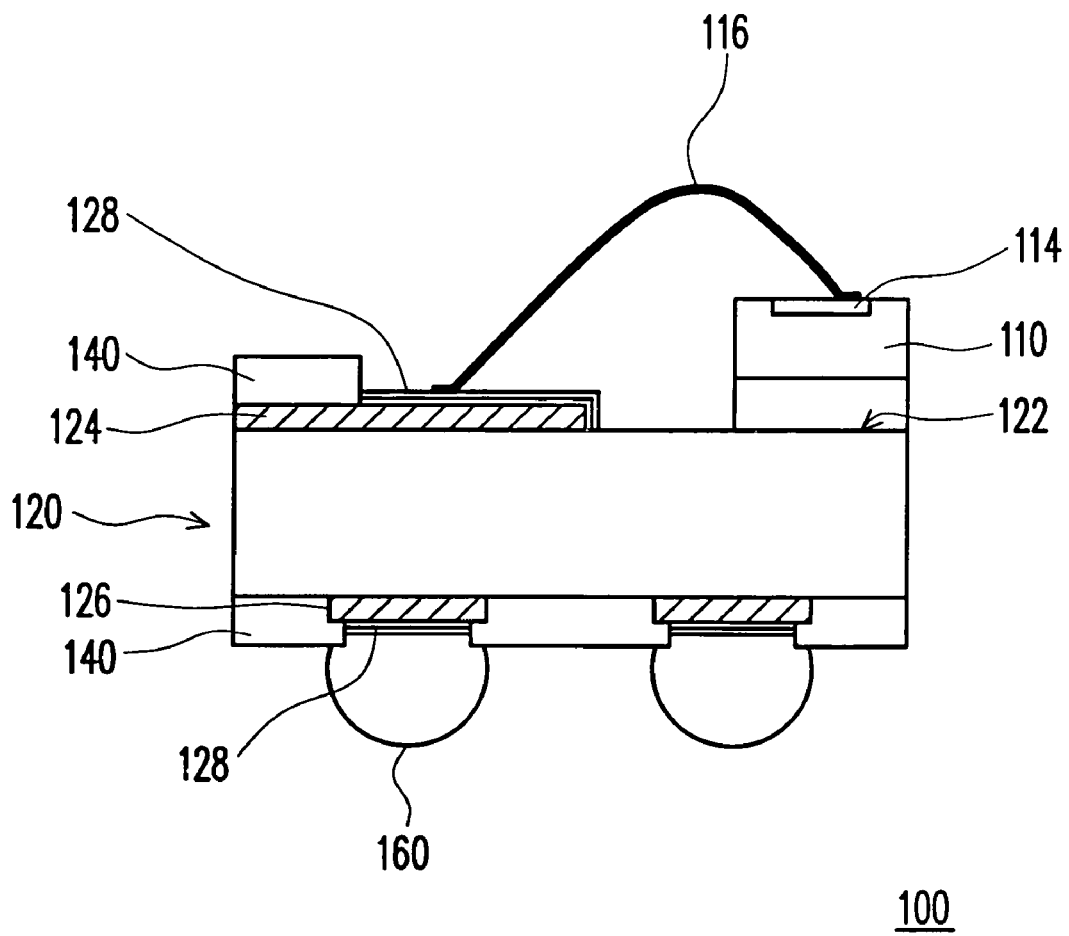
FIG. 1 is a schematic cross-sectional view showing part of a conventional wire-bonding chip package.

Reference will now be made in detail to the present preferred embodiments of the invention, examples of which are illustrated in the accompanying drawings. Wherever possible, the same reference numbers are used in the drawings and the description to refer to the same or like parts.

Figure 2:
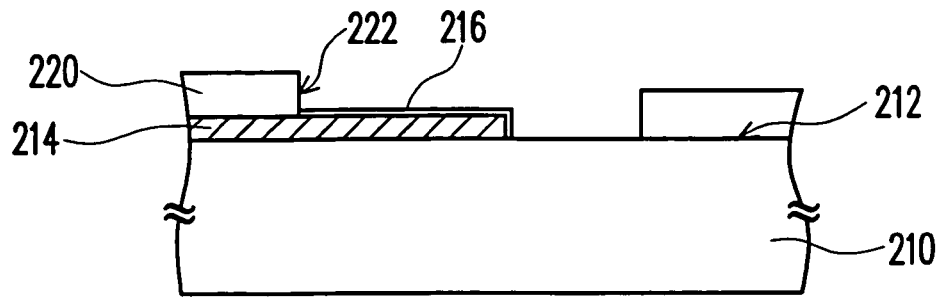
FIG. 2 is a schematic cross-sectional view showing part of a chip carrier according to one preferred embodiment of the present invention.

FIG. 2 is a schematic cross-sectional view showing part of a chip carrier according to one preferred embodiment of the present invention. As shown in FIG. 2, the chip carrier 200 is an organic dielectric substrate, an inorganic dielectric substrate or a flexible circuit board, for example. The chip carrier 200 comprises a laminated layer 210, an oxidation protection layer 216 and a solder mask layer 220. The laminated layer 210 comprises at least a patterned conductive layer and at least a dielectric layer. In a multi-layered circuit board, for example, the dielectric layer is disposed between two neighboring patterned conductive layers. The patterned conductive layers can be electrically connected through a plating through hole (PTH) or a via passing through the dielectric layers. The laminated layer 210 has a plurality of bonding finger pads 214 (only one is drawn in FIG. 2) disposed on a top surface 212. The solder mask layer 220 has at least one opening 222 that exposes a portion of the bonding finger pad 214. In the present embodiment, the bonding finger pads 214 are disposed parallel to each other and separated from each other by a small gap. The bonding finger pads 214 are electrically connected to a chip (not shown) through bonding wires. Obviously, the smaller the gap separating the parallel-aligned bonding finger pads, the higher will be the number of bonding wires that can be connected to the chip. Furthermore, if the laminated layer 210 comprises a single layer fabricated using soft dielectric material (such as polyimide), it can be used as a flexible printed circuit board.

It should be noted that an oxidation protection layer 216 is coated on the exposed bonding finger pad 214 to prevent the bonding finger pad 214 (fabricated from copper or aluminum material) on the chip carrier 200 from being oxidized. The oxidation protection layer 216 is a non-electrolytic metallic coating or an organic oxidation protection film. In particular, the oxidation protection layer 216 is able to reduce production cost by replacing the conventional nickel/gold metal coating formed in an electroplating operation using expensive materials and expensive electroplating equipment. In the present embodiment, the oxidation protection layer 216 is fabricated using a metallic material selected from a group consisting of nickel, gold, platinum, silver, cobalt, zinc, tin, bismuth and palladium, for example, or using an organic oxidation protection film selected from either an organic surface preservation (OSP) or a self-assembly monolayer (SAM). The aforementioned material is formed on the exposed surface of the bonding finger pads 214 using a simple and fast film-fabricating technique such as a chemical flash process, a physical vapor deposition (PVD) process, an electroless plating process or an immersion process. Hence, the present invention is able to produce the oxidation protection layer 216 much more quickly at a less cost than the conventional nickel/gold plating process.

Among the aforementioned film-fabricating techniques, the oxidation protection layer formed by an electroless plating process can be a nickel, a gold, a platinum a silver, a cobalt, a zinc, a tin or a palladium layer, for example. The oxidation protection layer formed by an immersion process can be a gold, a palladium, a tin, a silver, a bismuth, a nickel or a platinum layer, for example.

In the conventional electroplating process, a plating line has to form on the chip carrier before carrying out the electroplating operation. Moreover, the plating line must be cut after coating the nickel/gold layer to form independent signaling lines and bonding finger pads. Since a part of the area must be reserved to accommodate the plating line, the effective area of the chip carrier is reduced. As a result, the area for laying circuits and devices as well as ultimate electrical performance may be affected. On the other hand, there is no need to fabricate a plating line when the film-fabricating technique of the present invention is used to form the oxidation protection layer 216. Hence, the effective area on the chip carrier 200 is increased or the dimension of the chip carrier 200 is alternatively reduced. Ultimately, circuit layout and electrical performance on the chip carrier can be improved.

Figure 3:
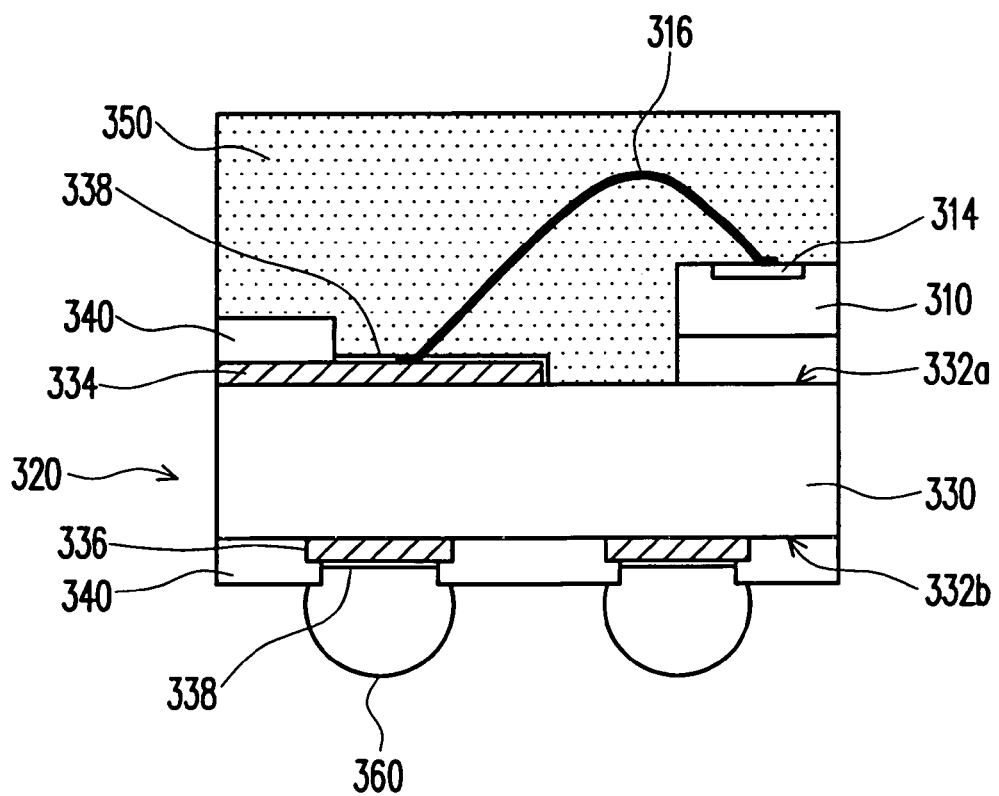
FIG. 3 is a schematic cross-sectional view showing part of a chip package according to one preferred embodiment of the present invention.

FIG. 3 is a schematic cross-sectional view showing part of a chip package according to one preferred embodiment of the present invention. Using a wire-bonding chip package as an example, the chip package 300 mainly comprises a chip 310, a plurality of bonding wires 316 (only one is shown) and a chip carrier 320. The chip 310 is disposed on the chip carrier 320. The bonding pads 314 on the chip 310 are electrically connected to the bonding finger pads 334 of the chip carrier 320 through bonding wires 316. The bonding wires could be fabricated using a low-cost metallic material selected from a group consisting of aluminum, copper, nickel, titanium, tungsten, platinum, silver and palladium. In addition, the chip carrier 320 comprises a laminated layer 330, an oxidation protection layer 338 and a soldering mask layer 340. Using a multi-layered circuit board as an example, the top surface 332a and the bottom surface 332b of the laminated layer 330 have a plurality of bonding finger pads 334 and a plurality of lower contacts 336. Furthermore, the solder mask layer 340 covers both the top surface 332a and the bottom surface 332b of the laminated layer 330 but has openings that expose a portion or all of the top surface of the bonding finger pads 334 and the lower contacts 336.

It should be noted that an oxidation protection layer 338 is formed on the exposed bonding finger pads 334 and the exposed lower contacts 336 using a simple and fast film-coating technique to prevent any oxidation from affecting electrical performance. The oxidation protection layer 338 is a metallic film formed by performing a chemical flashing process, a physical vapor deposition (PVD) process, an electroless plating process or an immersion process, for example. The oxidation protection layer 338 has a thickness smaller than the conventional nickel/gold electroplated layer (about 5.5 μm), preferably smaller than or equal to 0.5 μm. Hence, compared with the prior art of the high cost of gold and the high resistance of nickel and the high impurity content of nickel in fabricating a nickel/gold electroplated oxidation protection layer, the cost of fabricating the oxidation protection layer 338 and the bonding wires 316 in the present invention is low. Furthermore, by breaking a portion of the oxidation protection layer 338 on the bonding finger pad, one end of the bonding wire 316 directly contacts the bonding finger pad 334 to improve surface bonding strength and overall transmission quality.

In addition, the chip 310, the bonding finger pads 334 and the bonding wires 316 of the chip carrier 320 can be encapsulated using a molding compound 350 after completing the wire-bonding process so that the chip 310 and the bonding wires 316 are protected. Since the tensile strength of the bonding between the bonding wires 316 and the bonding finger pads 334 is raised in the present embodiment, the sweeping and sagging in the bonding wires 316 due to the impact in injecting molding compound 350 is reduced. Furthermore, using a ball grid array (BGA) chip package as an example, a plurality of solder balls 360 can be implanted to the lower contacts 336 of the laminated layer 330 to serve as media of contact on the chip package structure 300 for connecting with external devices.

The chip carrier and chip package structure according to the present invention utilizes a simple and fast film-forming technique to form an oxidation protection layer over the exposed bonding finger pads or other contacts. Hence, it is not needed neither to coat a nickel/gold film over the bonding finger pads or other contacts to serve as an oxidation protection layer using expensive electroplating equipment nor to form plating line on the chip carrier or reserve space for laying the plating line. In other words, the present invention reduces time and cost for fabricating the chip carrier, increases the effective area of the chip carrier and improves the electrical performance of the chip package.

In summary, major advantages of the chip carrier and chip package structure of the present invention includes:

1. By replacing high-cost electroplating process with a simple and fast film-fabricating technique, the time and cost for fabricating a chip carrier is reduced.

2. There is no need to fabricate plating line on the chip carrier or reserve space for forming the plating line. Hence, the effective area of the chip carrier is increased and electrical performance of the package is improved.

3. The bonding wires are fabricated using low-cost metallic material (such as copper or aluminum) instead of gold. Thus, the cost of fabricating the chip package can be reduced.

4. The junction of bonding interface between the bonding wire and the bonding finger pad is improved by the direct contact, so that tensile strength of the bonding is increased. Hence, the chip package can have an excellent reliability.

5. The chip carrier can be used as a single layer substrate or a multi-layered circuit substrate. Furthermore, the bonding finger pads can be aligned in parallel and separated from each other by a small gap so that the reliability of the bonded wires is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip carrier for supporting a chip, comprising:
    a laminated layer having a non-plating line design, a top surface and a bottom surface, wherein the laminated layer has at least a bonding finger pad on the top surface and the bonding finger pad is electrically connected to the chip through a bonding wire; and
    an oxidation protection layer covering the bonding finger pad, wherein the oxidation protection layer is a non-electrolytic metallic coating, and wherein the oxidation protection layer has a thickness smaller than or equal to 0.5 μm, and the material constituting the oxidation protection layer is selected from a group consisting of cobalt, zinc, tin, and bismuth; and
    wherein the bonding wire penetrates the oxidation protection layer and directly connects the bonding finger pad.

2. The chip carrier of claim 1, wherein the chip carrier further comprises a soldering mask layer covering the top surface of the laminated layer and having an opening that exposes a portion of the bonding finger pad.

3. The chip carrier of claim 1, wherein the material constituting the bonding wire is selected from a group consisting of aluminum, copper, nickel, titanium, tungsten, platinum, silver and palladium.

4. The chip carrier of claim 1, wherein the bonding finger pad comprises a copper pad or an aluminum pad.

5. A chip package structure, comprising:
    a chip;
    a chip carrier for supporting the chip and electrically connecting to the chip, having:
        a laminated layer having a non-plating line design, a top surface and a bottom surface, wherein the laminated layer has at least a bonding finger pad on the top surface, wherein the bonding finger pad comprises a copper pad or an aluminum pad;
        an oxidation protection layer covering the bonding finger pad, wherein the oxidation protection layer is a non-electrolytic metallic coating, and the material constituting the oxidation protection layer is selected from a group consisting of cobalt, zinc, tin, and bismuth; and
        at least a bonding wire connecting the chip and the bonding finger pad, wherein the bonding wire penetrates the oxidation protection layer and directly connects the bonding finger pad.

6. The chip package structure of claim 5, wherein the laminated layer further comprises at least a dielectric layer such that the bonding finger pad is disposed over the dielectric layer.

7. The chip package structure of claim 5, further comprises a soldering mask layer covering the top surface of the laminated layer and having an opening that exposes a portion of the bonding finger pad.

8. The chip package structure of claim 5, wherein the material constituting the bonding wire is selected from a group consisting of aluminum, copper, nickel, titanium, tungsten, platinum, silver and palladium.

9. A chip package structure, comprising:
    a chip;
    a chip carrier for supporting the chip and electrically connecting to the chip, having:
        a laminated layer having a non-plating line design, a top surface and a bottom surface, wherein the laminated layer has at least a bonding finger pad on the top surface, wherein the bonding finger pad comprises a copper pad or an aluminum pad;

an oxidation protection layer covering the bonding finger pad, wherein the oxidation protection layer is an organic oxidation protection film; and at least a bonding wire connecting the chip and the bonding finger pad, wherein the bonding wire penetrates the oxidation protection layer and directly connects the bonding finger pad.

10. The chip package structure of claim 9, wherein the laminated layer further comprises at least a dielectric layer such that the bonding finger pad is disposed over the dielectric layer.

11. The chip package structure of claim 9, further comprises a soldering mask layer covering the top surface of the laminated layer and having an opening that exposes a portion of the bonding finger pad.

12. The chip package structure of claim 9, wherein the material constituting the bonding wire is selected from a group consisting of aluminum, copper, nickel, titanium, tungsten, platinum, silver and palladium.

13. The chip package structure of claim 9, wherein the organic oxidation protection film is an organic surface preservation (OSP) or a self-assembly monolayer (SAM).

* * * * *